United States Patent [19]

Maeda et al.

[11] Patent Number: 5,695,858
[45] Date of Patent: Dec. 9, 1997

[54] MAGNETORESISTIVE ELEMENT

[75] Inventors: Atsushi Maeda; Minoru Kume; Toshio Tanuma, all of Osaka, Japan

[73] Assignee: Sanyo Electric Co., Ltd., Moriguchi, Japan

[21] Appl. No.: 406,671

[22] Filed: Mar. 20, 1995

[30] Foreign Application Priority Data

Mar. 23, 1994 [JP] Japan .................. 6-052054

[51] Int. Cl.$^6$ .................. H01L 43/00; B32B 7/02
[52] U.S. Cl. .................. 428/209; 428/611; 428/688; 428/692; 428/900; 360/113; 338/32 R; 324/252
[58] Field of Search .................. 428/209, 210, 428/688, 900, 611, 692; 360/113, 111; 338/32 R; 324/252

[56] References Cited

U.S. PATENT DOCUMENTS

| | | |
|---|---|---|
| 3,567,525 | 3/1971 | Graham et al. . |
| 3,975,772 | 8/1976 | Lin . |
| 4,623,867 | 11/1986 | Lundquist .................. 338/32 R |
| 4,949,039 | 8/1990 | Grünberg . |
| 5,117,321 | 5/1992 | Nakanishi et al. . |
| 5,164,025 | 11/1992 | Hasegawa . |
| 5,196,821 | 3/1993 | Partin .................. 338/32 R |
| 5,268,043 | 12/1993 | McCowen . |
| 5,287,553 | 2/1994 | Ahn et al. . |
| 5,313,186 | 5/1994 | Schuhl .................. 324/252 |
| 5,366,815 | 11/1994 | Araki et al. . |
| 5,474,833 | 12/1995 | Etienne .................. 428/209 |

FOREIGN PATENT DOCUMENTS

| | | |
|---|---|---|
| 58-36406 | 8/1983 | Japan . |
| 4-218982 | 8/1992 | Japan . |
| 4-358310 | 12/1992 | Japan . |
| 4-360009 | 12/1992 | Japan . |

OTHER PUBLICATIONS

A. E. Berkowitz et al. "Giant Magnetoresistance in Heterogeneous Cu–Co Alloys" Physical Review Letters, vol. 68, No. 25, Jun. 1992, pp. 3745–3748.

A. Chaiken et al. "Low–field spin–valve magnetoresistance in Fe–Cu–Co sandwiches" Appl. Phys. Lett. 59 Jul. 1991, pp. 240–242.

B. Dieny et al. "Giant magnetoresistance of magnetically soft sandwiches: Dependence on temperature and on layer thicknesses" Physical Review B, Jan. 1992, pp. 806–813.

D. H. Mosca et al. "Oscillatory interlayer coupling and giant magnetoresistance in Co/Cu multilayers" Journal of Magnetism and Magnetic Materials 94 (1991), pp. L.1–L.5.

Dieny et al. "Giant Magnetoresistance in Soft Ferromagnetic Layers" Physical Review Condensed Matter, 43 (1991) Jan. vol. 1, Part B.

J. Smyth et al. "Hysteresis in Lithographic Arrays . . . ", J. Appl. Phys. Apr. 1994, vol. 69, No. 8, pp. 5262–5266.

Shinjo et al. "Metallic Superlattices—Artificially Structured Materials", ; Studies in physical and theoretical Chemistry 49; 1987.

Maeda et al.; "Magnetoresistance characteristics of grain–type alloy thin films of various compositions", J. Phys.: Condens. Matter 5 (1993) 6745–6752.

S. H. Liou et al. "The process–controlled magnetic properties of nanostructured Co/Ag composite films" J. Appl. Phys. 70 Nov. 91 (Magnetism of Fine Particles) pp. 5882–5884.

(List continued on next page.)

*Primary Examiner*—Patrick Ryan
*Assistant Examiner*—Marie R. Yamnitzky
*Attorney, Agent, or Firm*—W. G. Fasse; W. F. Fasse

[57] ABSTRACT

A magnetoresistive element includes a substrate, and a plurality of fine line structures, which are provided on the substrate to be substantially parallel to each other, and which each have an aspect ratio greater than 1. Each fine line structure has a multilayer structure of a first ferromagnetic layer, a non-magnetic conductive layer and a second ferromagnetic layer. Magnetic moments of the first and second ferromagnetic layers orient antiparallel to each other in a state with no external magnetic field being applied.

21 Claims, 9 Drawing Sheets

OTHER PUBLICATIONS

P. Grünberg et al., Interlayer Exchange, Magnetotransport and Magnetic Domains in Fe/Cr Layered Structures, Journal of Magnetism and Magnetic Materials, 1992, pp. 1734–1738.

S. Demokritov et al., Evidence for Oscillations in the Interlayer Coupling of Fe Films Across Cr Films From Spin Waves and M(H) Curves, Europhysics Letters, Aug. 1991, pp. 881–886.

Hideo Fujiwara et al. Analytical Model of Giant MR in Multilayers With Biquadratic Coupling, Journal of Magnetism and Magnetic Materials, 1994, pp. L 23 –L29.

Martin Parker et al., Biquadratic Effects in Magnetic Multilayers with Low–Field Giant MR, Journal of the Magnetics Society of Japan, vol. 18, 1994, pp. 371–377.

MAGNETORESISTIVE ELEMENT

CROSS-REFERENCE TO RELATED APPLICATION

The present application relates to U.S. Ser. No. 08/511,012, filed on Aug. 3, 1995, now U.S. Pat. No. 5,620,789 and entitled MAGNETORESISTIVE FILM.

BACKGROUND OF THE INVENTION

1. Field of the Invention

The present invention relates to a magnetoresistive element (MR element) which is applied to a magnetoresistive head (MR head) or a magnetoresistive sensor (MR sensor).

2. Description of the Background Art

An MR element is adapted to detect a change in electric resistance of a magnetic film due to the application of a magnetic field, for measuring magnetic field strength and its change, and must have a large ratio of its magnetoresistance ratio relative to its operating magnetic field strength.

In a conventional MR head which is disclosed in Japanese Patent Publication No. 58-36406 (1983) or the like, an NiFe alloy (permalloy) is employed as a magnetoresistive magnetic material. However, permalloy has a small magnetoresistance ratio (MR ratio), and is not preferable as a material for the MR element.

In recent years, the following magnetoresistive films are known as those having higher magnetoresistance ratios as compared with a bulk material such as permalloy:

(1) an artificial grid type magnetoresistive film which is formed by alternately stacking ferromagnetic and non-magnetic films consisting of Co and Cu respectively;

(2) a spin valve type magnetoresistive element which is formed by stacking an antiferromagnetic film consisting of MnFe alloy, a ferromagnetic film consisting of Co, a non-magnetic conductive film consisting of Cu, and a ferromagnetic film consisting of an NiFe alloy in this order; and (3) a coercive force difference type magnetoresistive film which is formed by stacking a ferromagnetic film consisting of Fe, a non-magnetic conductive film consisting of Cu, and a ferromagnetic film consisting of Co in this order.

While these magnetoresistive films exhibit relatively high magnetoresistance ratios, it is necessary to further reduce the operating magnetic field strength, in order to improve the performance of an MR element.

SUMMARY OF THE INVENTION

An object of the present invention is to provide a magnetoresistive element which is provided with magnetoresistive films each consisting of a multilayer structure having a high magnetoresistance ratio and a small operating magnetic field strength.

The magnetoresistive element according to the present invention comprises a substrate, and a plurality of fine line portions provided on the substrate to be substantially parallel to each other, each having an aspect ratio which is greater than 1.

According to the present invention, the aspect ratio of each fine line portion indicates the ratio of the length to the width of the fine line portion. Due to the aspect ratio which is greater than 1, the shape of each fine line portion is so set that its length is larger than its width. Further, the thickness of each fine line portion is considerably smaller than its width, and hence the fine line portion has a width and a thickness which are smaller than its length. According to the present invention, the aspect ratio of each fine line portion is preferably at least 10.

According to the present invention, the width of each fine line portion and the distance between each adjacent pair of fine lines are preferably not more than 10 μm, and more preferably in the range of 0.1 to 2 μm, respectively.

According to a first aspect of the present invention, each fine line portion has a structure which is formed by alternately stacking ferromagnetic and non-magnetic conductive layers, so that an antiferromagnetic coupling is formed between the ferromagnetic layers which are stacked with each other through the respective interposed non-magnetic conductive layer. This is the multilayer structure of the aforementioned artificial grid type magnetoresistive film. Therefore, the ferromagnetic and non-magnetic conductive layers are formed by Co and Cu layers respectively, for example.

According to a second aspect of the present invention, each fine line portion is formed by a multilayer structure obtained by stacking a first ferromagnetic layer, a non-magnetic conductive layer provided on the first ferromagnetic layer, and a second ferromagnetic layer provided on the non-magnetic conductive layer and having a magnetic moment which is apt to orient antiparallel to that of the first ferromagnetic layer when a weak external magnetic field is applied.

In a first mode according to the second aspect of the present invention, the multilayer structure of each fine line portion further comprises an antiferromagnetic layer which is provided on the first ferromagnetic layer or the second ferromagnetic layer. According to the first mode of the second aspect, therefore, the antiferromagnetic layer, the first ferromagnetic layer, the non-magnetic conductive layer and the second ferromagnetic layer are stacked. In the first mode, therefore, each fine line portion has the structure of the spin valve type magnetoresistive film. According to this first mode, the antiferromagnetic layer, the first ferromagnetic layer, the non-magnetic conductive layer and the second ferromagnetic layer are formed by MnFe, Co, Cu and NiFe layers respectively, for example.

In a second mode according to the second aspect of the present invention, the second ferromagnetic layer is formed by a layer having a coercive force which is different from that of the first ferromagnetic layer. Therefore, each fine line portion according to the second mode of the second aspect has the structure of the coercive force difference type magnetoresistive film. According to this mode, each fine line portion has a structure which is formed by stacking the first ferromagnetic layer, the non-magnetic conductive layer and the second ferromagnetic layer in this order. In the second mode of the second aspect, the first ferromagnetic layer, the non-magnetic conductive layer and the second ferromagnetic layer are formed by Fe, Cu and Co layers respectively, for example.

The magnetoresistive element according to the present invention has a large magnetoresistance ratio, for the following reasons.

The scattering probability of conduction electrons passing through the non-magnetic conductive layer depends on the directions of the magnetic moments of the ferromagnetic layers which are stacked with each other through the non-magnetic conductive layer. This scattering probability is minimized when the directions of the magnetic moments of the ferromagnetic layers are parallel to each other, while the same is maximized when the directions of the magnetic moments are antiparallel to each other.

The ferromagnetic layers have a domain, and hence there are considerable degrees of freedom of the magnetic moments in the in-plane direction. Consequently, the above described parallel and antiparallel states are not perfect.

According to the present invention, magnetoresistive films are defined by the fine line portions. Therefore, the magnetic moments of the ferromagnetic layers are further reduced in degree of freedom due to the geometric anisotropic effect, to orient further parallel to the longitudinal direction of the fine line portions. Consequently, the parallel and antiparallel states become more perfect.

According to the present invention, further, the fine line portions are provided to be substantially parallel to each other, whereby the magnetic moments of the corresponding ferromagnetic layers of adjacent fine line portions are conceivably apt to orient further parallel to each other. Consequently, the magnetic moments of the ferromagnetic layers which are stacked with each other through the non-magnetic conductive layers are substantially antiparallel to each other with a weak external magnetic field. This also makes the above mentioned parallel and antiparallel states more perfect.

When an appropriate weak external magnetic field is present, therefore, conduction electrons pass through the non-magnetic conductive layer in a direction substantially parallel to the longitudinal direction of each fine line portion, substantially oppositely to the direction of the magnetic moment of one of the ferromagnetic layers. Consequently, the conduction electrons are remarkably scattered to increase the resistance.

When a strong external magnetic field which is stronger than a saturation magnetic field is present along the longitudinal direction of each fine line direction, on the other hand, the magnetic moments of the ferromagnetic layers which are stacked with each other through the non-magnetic conductive layer are directed substantially parallel to the direction of the external magnetic field respectively. Further, conduction electrons pass through the non-magnetic conductive layer substantially parallel to the longitudinal direction of the fine line portion as well as the direction of the external magnetic field. Therefore, the conduction electrons pass through the non-magnetic conductive layer substantially parallel to the magnetic moments of the ferromagnetic layers. Thus, scattering is reduced to reduce the resistance.

In the magnetoresistive element according to the present invention, as hereinabove described, the magnetoresistance effect is increased due to a small degree of freedom of the magnetic moment caused by the structure of a plurality of fine line portions.

The reason why the operating magnetic field is reduced in the inventive magnetoresistive element is first conceivably the geometric anisotropy of the fine line portions. Namely, the magnetic moment has a small degree of freedom in the latitudinal or crosswise direction so that the magnetic moment turns over in a digital manner, not in a rotational manner. Second, the operating magnetic field is conceivably reduced since a plurality of magnetic moments operate in a coherent manner.

According to the first aspect of the present invention, each fine line portion has the structure of the artificial grid type magnetoresistive film. In such a magnetoresistive film structure, the magnetic moments of the ferromagnetic layers which are adjacent to each other through the non-magnetic conductive layer are apt to orient antiparallel to each other, when a weak external magnetic field is applied. Consequently, a large magnetoresistance effect is attained as described above.

According to the second aspect of the present invention, each fine line portion has the first ferromagnetic layer, the non-magnetic conductive layer and the second ferromagnetic layer which are stacked with each other. The second ferromagnetic layer has a magnetic moment which is apt to orient antiparallel to that of the first ferromagnetic layer in a state with application of a weak external magnetic field. Therefore, the magnetic moments of the first and second ferromagnetic layers are apt to orient antiparallel to each other. Consequently, a large magnetoresistance effect is attained as described above.

In the first mode according to the second aspect of the present invention, each fine line portion has the structure of the spin valve type magnetoresistive film having the antiferromagnetic layer, the first ferromagnetic layer, the non-magnetic conductive layer and the second ferromagnetic layer which are stacked with each other. When a weak external magnetic field is present, the magnetic moment of the first ferromagnetic layer which is adjacent to the antiferromagnetic layer is apt to be parallel to that of the antiferromagnetic layer, whereby the magnetic moments of the first and second ferromagnetic layers are apt to orient antiparallel to each other.

In the second mode according to the second aspect of the present invention, each fine line portion has the structure of the coercive force difference type magnetoresistive film provided with the first ferromagnetic layer, the non-magnetic conductive layer and the second ferromagnetic layer which are stacked with each other. When weak external magnetic field is present, the magnetic moments of the first and second ferromagnetic layers are apt to orient antiparallel to each other due to the coercive force difference.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS AND OF THE BEST MODE OF THE INVENTION

Figure 1:
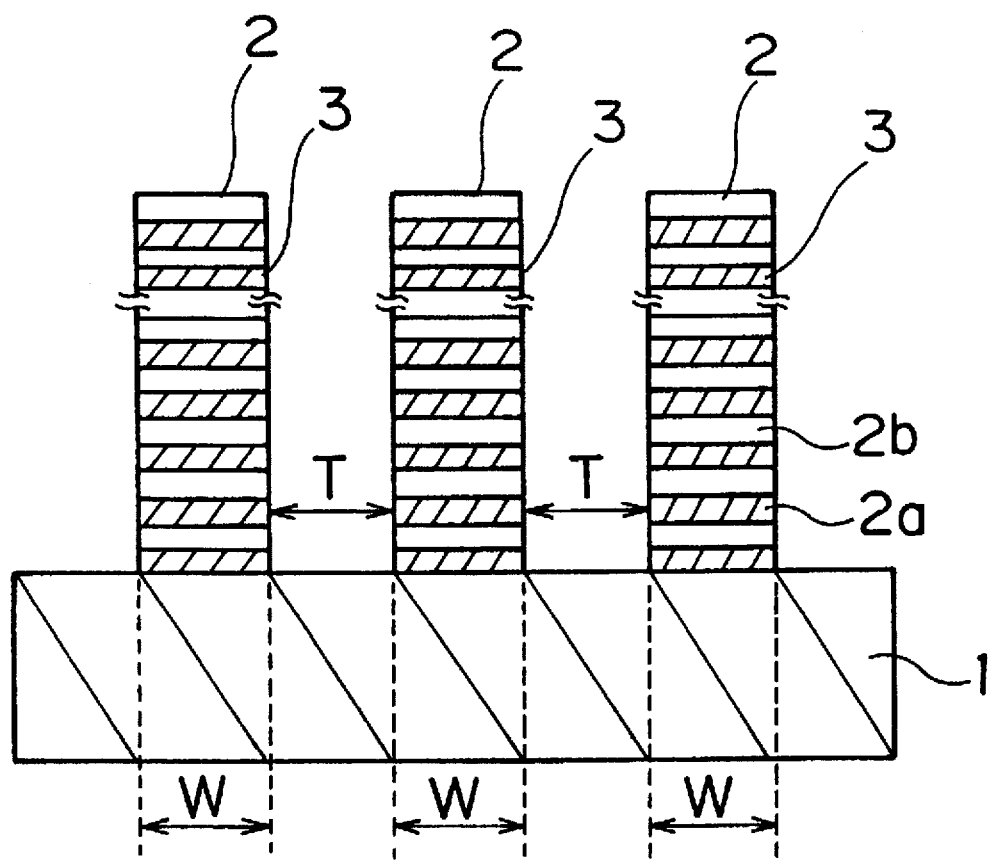
FIG. 1 is a sectional view showing a magnetoresistive element of an embodiment according to a first aspect of the present invention.

FIG. 1 is a sectional view showing a magnetoresistive element of an embodiment according to a first aspect of the present invention. Referring to FIG. 1, a plurality of fine line portions 2 are provided on a non-magnetic substrate 1 of glass, to be substantially parallel to each other. The distance T between each adjacent pair of the fine line portions 2 is about 2 µm, while each fine line portion 2 has a width W of about 2 µm and a length of about 90 µm. Therefore, each fine line portion 2 according to this embodiment has an aspect ratio of about 45.

Each fine line portion 2 is formed by a laminate (multilayer structure) 3 which is obtained by alternately stacking 29 sets of ferromagnetic layers 2a of Co having thicknesses of 15 Å, and non-magnetic conductive layers (non-magnetic metal layers) 2b of Cu having thicknesses of 20 Å with each other.

FIGS. 2A to 2D are sectional views showing steps of manufacturing the magnetoresistive element according to the embodiment shown in FIG. 1.

Figure 2A:
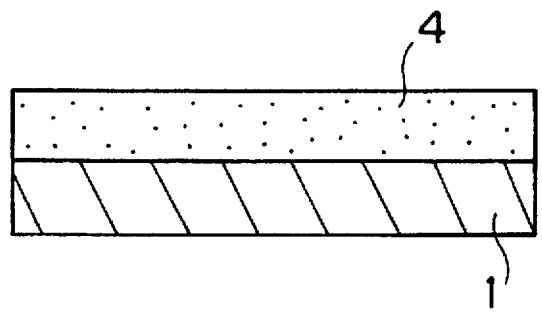
FIGS. 2A to 2D are sectional views showing steps of manufacturing the magnetoresistive element according to the embodiment shown in FIG. 1.

Referring to FIG. 2A, a resist material is first applied to the overall upper surface of the non-magnetic substrate 1 of glass by spin coating or the like, and is then heat treated to form a resist film 4 having a thickness of 1 to 2 µm.

Figure 2B:
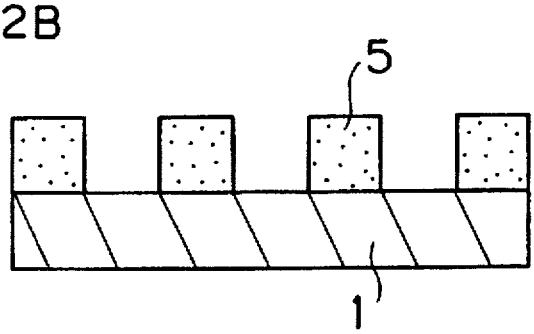

Referring to FIG. 2B, the resist film 4 is then exposed in the form of fine lines. The exposed fine line portions are formed to be parallel to each other at regular intervals. Thereafter the resist film 4 is developed to remove the exposed portions, thereby defining resist films 5 in the form of fine lines.

Figure 2C:
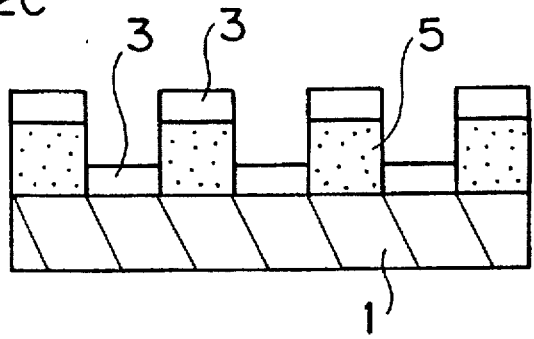

Referring to FIG. 2C, ferromagnetic and non-magnetic conductive layers are then alternately formed on the substrate 1 and the resist films 5 by electron beam deposition, thereby forming the laminates 3.

Figure 2D:
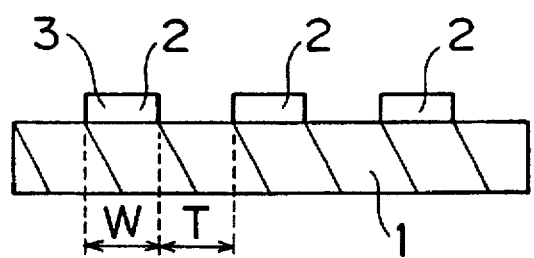

Referring to FIG. 2D, the resist films 5 are then removed to leave the laminates 3 having the widths W, which are parallel to each other at the distances T, by the so-called lift-off method. These laminates 3 define the fine line portions 2.

As to a sample (Example 1) of the magnetoresistive element according to the embodiment shown in FIG. 1 and another sample (comparative example 1) of a magnetoresistive element comprising a substrate and a magnetoresistive film which was provided thereon similarly to Example 1 except that the magnetoresistive film was not in the form of fine lines, magnetoresistance values were measured by varying external magnetic fields in the range of −500 to +500 Oe by a four-probe method, to obtain magnetoresistance ratios (MR ratio=ΔR/R) from the results.

The MR ratio is defined as $(R(H)-R_{min})/R_{min} \times 100$ (%), where R(H) and $R_{min}$ represent a resistance value at applied magnetic field strength H and the minimum resistance value respectively.

Figure 3:
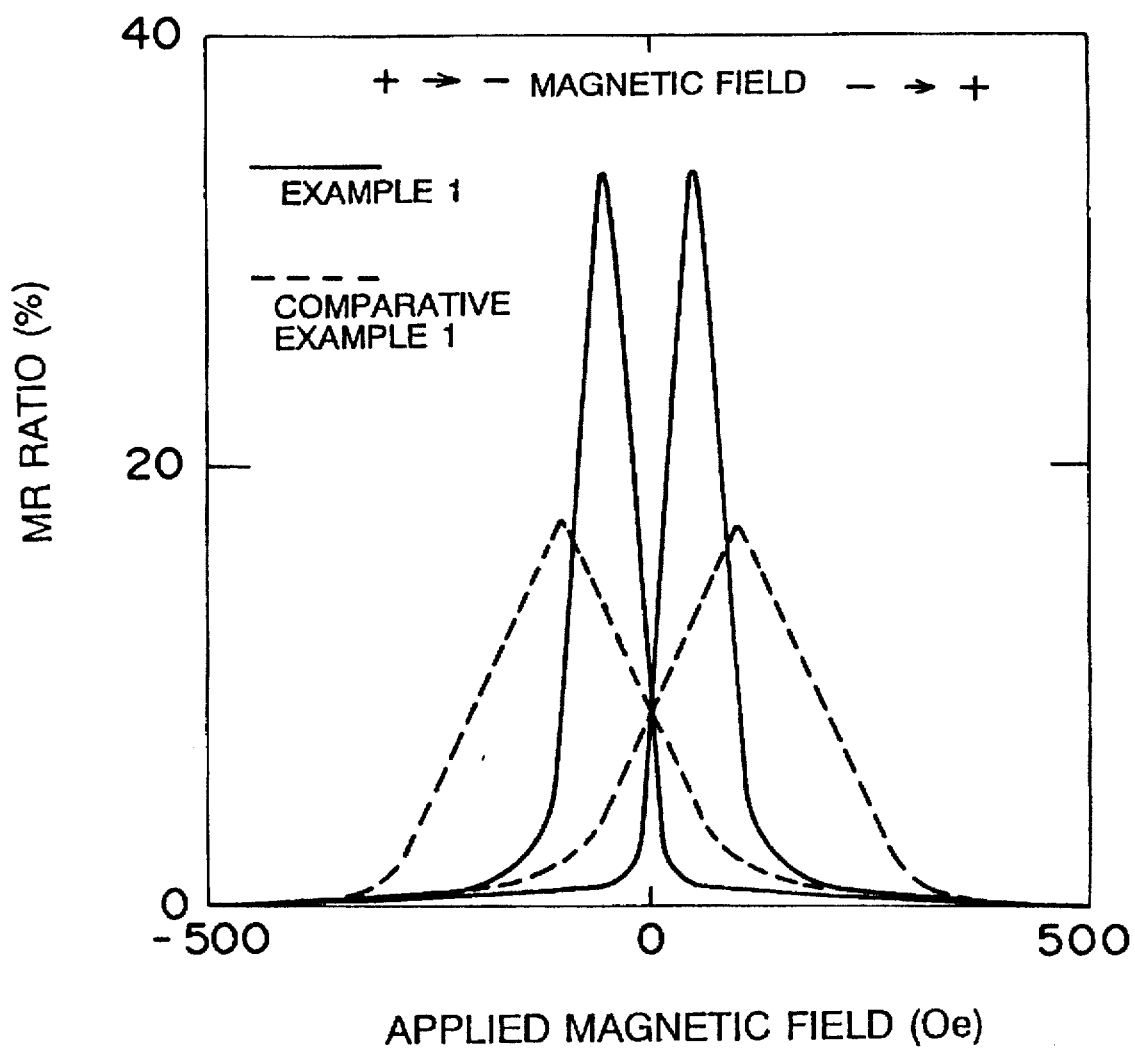
FIG. 3 illustrates relations between MR ratios and applied magnetic field strength values in magnetoresistive elements according to Example 1 and comparative example 1.

FIG. 3 illustrates relations between the MR ratios and the applied magnetic field strength values as to Example 1 and comparative example 1. Table 1 shows the maximum MR ratios and operating magnetic fields as to Example 1 and comparative example 1.

TABLE 1

|  | Example 1 | Comparative Example 1 |
|---|---|---|
| Maximum MR Ratio (%) | 33.5 | 17.1 |
| Operating Magnetic Field (Oe) | 152 | 310 |

As clearly understood from FIG. 3 and Table 1, the maximum MR ratio of the magnetoresistive element according to Example 1 is about 34%, which is extremely higher than that of comparative example 1 of about 17%. Further, the operating magnetic field of Example 1 is about 150 Oe, which is remarkably smaller than that of comparative example 1 of about 310 Oe. Thus, it is understood that the saturation magnetic field in Example 1 is reduced as compared with comparative example 1.

Figure 4A:
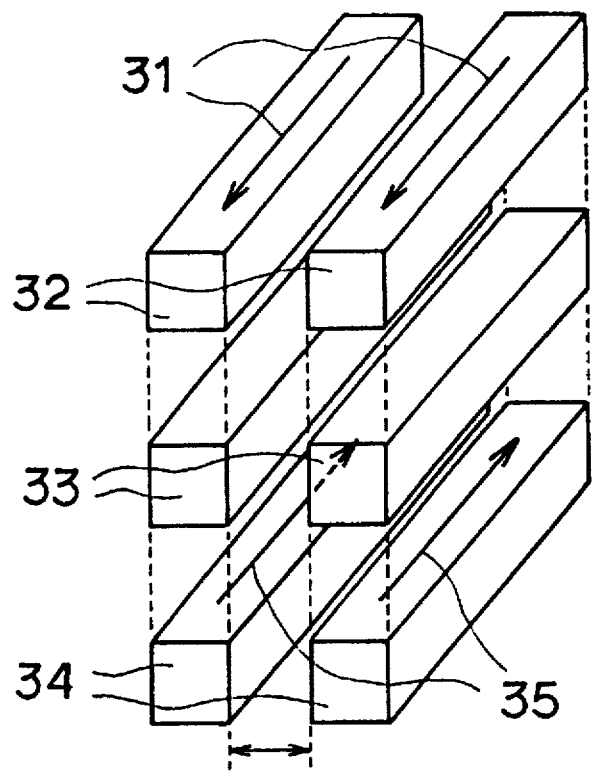
FIGS. 4A and 4B are model diagrams showing magnetic moments of the inventive magnetoresistive element and a conventional magnetoresistive element respectively.
Figure 4B:
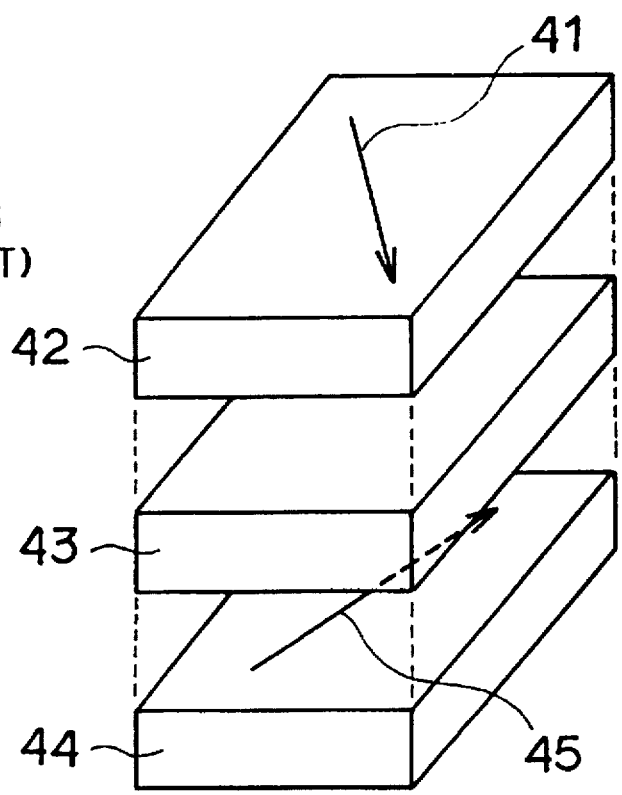

FIGS. 4A and 4B are model diagrams for illustrating the reason why the MR ratio is increased in the magnetoresistive element according to the present invention. FIG. 4A shows a magnetoresistive element according to the present invention, and FIG. 4B shows a conventional magnetoresistive element. In each of FIGS. 4A and 4B, a weak external magnetic field is present.

Referring to FIG. 4A, ferromagnetic layers 32 and 34 are stacked with each other through non-magnetic conductive layers 33. All of the ferromagnetic layers 32, the non-magnetic conductive layers 33 and the ferromagnetic layers 34 are in the form of fine lines.

Referring to FIG. 4B, ferromagnetic layers 42 and 44 are stacked with each other through a non-magnetic conductive layer 43. The ferromagnetic layer 42, the non-magnetic conductive layer 43 and the ferromagnetic layer 44 are in the form of continuous wide films which are provided in a conventional magnetoresistive film.

Referring to FIG. 4A, antiferromagnetic couplings are present between the ferromagnetic layers 32 and 34 which are stacked with each other through the non-magnetic conductive layers 33, whereby magnetic moments 31 and 35 of the ferromagnetic layers 32 and 34 are apt to orient antiparallel to each other.

In the magnetoresistive element according to the present invention, the ferromagnetic layers 32 and 34 are in the form of fine lines respectively. Due to a geometric anisotropic effect, therefore, the magnetic moments 31 and 35 of the ferromagnetic layers 32 and 34 are apt to orient antiparallel to each other. Further, the plurality of fine line portions are separated substantially parallel to each other, whereby the magnetic moments of the corresponding ferromagnetic layers of the adjacent fine line portions are apt to be parallel to each other by interactions between the magnetic moments of the corresponding ferromagnetic layers. Consequently, the magnetic moments 31 and 35 of the retromagnetic layers 32 and 34 which are stacked with each other through the non-magnetic conductive layers 33 are apt to orient more perfectly antiparallel to each other.

Also in the conventional magnetoresistive element shown in FIG. 4B, an antiferromagnetic coupling is present between the ferromagnetic layers 42 and 44 which are stacked with each other through the non-magnetic conductive layer 43, whereby magnetic moments 41 and 45 of the ferromagnetic layers 42 and 44 are apt to orient at least somewhat antiparallel to each other. However, the ferromagnetic layers 42 and 44 are in the form of relatively wide continuous films, and hence the magnetic moments 41 and 45 thereof have large degrees of freedom in the in-plane direction. Therefore, the magnetic moments 41 and 45 of the ferromagnetic layers 42 and 44 are not directly or perfectly antiparallel to each other, as shown in FIG. 4B.

In the inventive magnetoresistive element, as hereinabove described, an angle formed by the direction of conduction electrons passing through each non-magnetic conductive layer and that of the magnetic moment of one of the ferromagnetic layers which are stacked with each other through the non-magnetic conductive layer comes closer to 180° as compared with the conventional element having a magnetoresistive film when an appropriate weak external magnetic field is present. Thus, scattering of the conduction electrons is so increased that the resistance of the inventive magnetoresistive element is increased as compared with the conventional magnetoresistive element.

When a magnetic field which is stronger than a saturation magnetic field is applied, the magnetic moments of the ferromagnetic layers which are stacked with each other through each non-magnetic conductive layer are parallel to each other while the direction of passage of the conduction electrons is also parallel to the direction of the magnetic moments. Therefore, scattering of electrons is reduced. This applies to both of the inventive and conventional magnetoresistive elements shown in FIGS. 4A and 4B. Thus, the minimum resistance values $R_{min}$ of these elements are substantially identical to each other.

As hereinabove described, the magnetoresistive element according to the present invention has the maximum resistance value and the minimum resistance value $R_{min}$ which are larger than and identical to those of the conventional magnetoresistive element respectively, whereby the maximum MR ratio is increased.

The reason why the operating magnetic field is reduced in the inventive magnetoresistive element is first conceivably the geometric anisotropic effect. Namely, the magnetic moment has a small degree of freedom in the latitudinal or crosswise direction so that the magnetic moment turns over in digital manner, not in a rotational manner. Second, the operating magnetic field is conceivably reduced since a plurality of magnetic moments operate in a coherent manner.

For the purpose of comparison, fine line structures consisting of an NiFe alloy were formed on a substrate of glass, for measuring the maximum MR ratio and the operating magnetic field. While the comparative magnetoresistive element has fine line structures which are similar to those shown in FIG. 1, the fine line portions are not in the structure of the multilayer films shown in FIG. 1 but simply composed of the NiFe alloy. In the comparative magnetoresistive element having the fine line portions consisting of the NiFe alloy, the maximum MR ratio and the operating magnetic field were inferior to those of the inventive magnetoresistive element. The numerical values were deteriorated as the widths of the fine line portions were reduced. The effect of the present invention was not attained in the comparative magnetoresistive element having fine line portions consisting of an NiFe alloy conceivably because conduction electrons passed not through a non-magnetic conductive layer but through a magnetic substance in such an NiFe alloy, dissimilarly to the present invention. Namely, the comparative element conceivably operates by a principle of magnetoresistive which is different from that of the inventive effect.

In the magnetoresistive element according to the first aspect of the present invention, the ferromagnetic layers and the non-magnetic conductive layers may be in combinations different from the above. For example, the ferromagnetic layers may be selected from Fe and Co layers and alloy layers thereof. On the other hand, the non-magnetic conductive layers may be selected from Cu and Ag layers. In order to develop antiferromagnetic couplings between the ferromagnetic layers which are stacked with each other through the non-magnetic conductive layers, it is necessary to properly select the thicknesses of the non-magnetic conductive layers.

Figure 5:
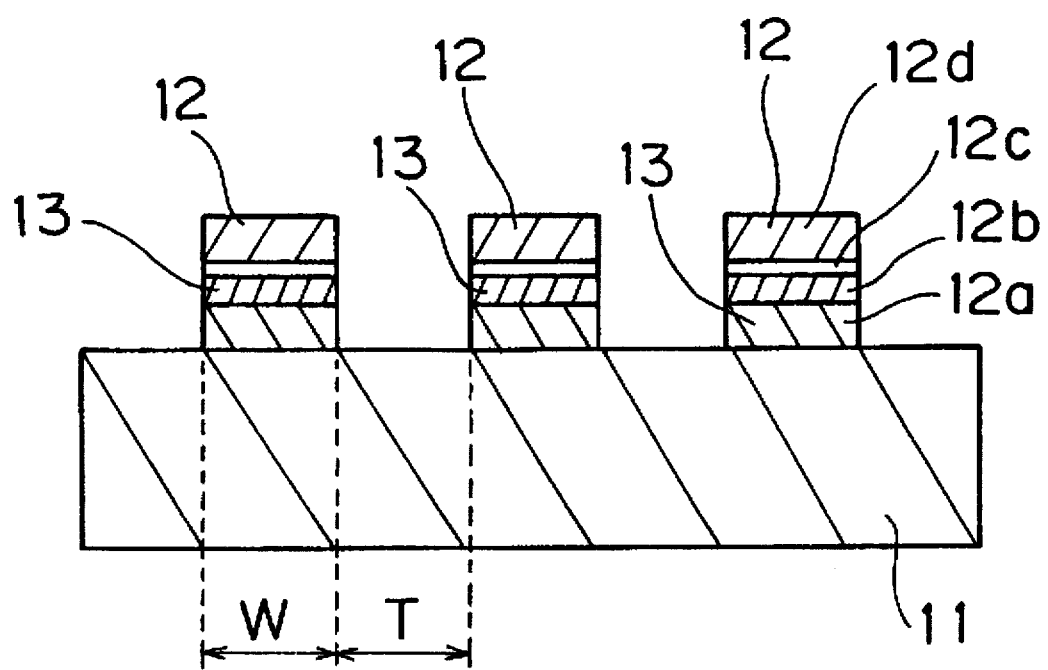
FIG. 5 is a sectional view showing a magnetoresistive element according to a first mode of a second aspect of the present invention.

FIG. 5 is a sectional view showing a magnetoresistive element according to a first mode of a second aspect of the present invention. Referring to FIG. 5, fine line portions 12 having widths W are provided on a non-magnetic substrate 11 of glass, at distances T. According to this embodiment, the distances T and the widths W are about 2 μm respectively. Each fine line portion 12 has a length of 90 μm, and hence its aspect ratio is 45. Each fine line portion 12 is formed by a laminate 13 which is obtained by stacking an antiferromagnetic layer 12a, a first ferromagnetic layer 12b, a non-magnetic conductive layer 12c, and a second ferromagnetic layer 12d with each other.

The antiferromagnetic layer 12a is formed by an MnFe alloy film, containing 50 percent by weight of Mn and 50 percent by weight of Fe and having a thickness of 80 Å, while the first ferromagnetic layer 12b is formed by a Co film, having a thickness of 50 Å. The non-magnetic conductive layer 12c is formed by a Cu film having a thickness of 22 Å, while the second ferromagnetic layer 12d is formed by an NiFe alloy film, containing 80 percent by weight of Ni and 20 percent by weight of Fe and having a thickness of 75 Å.

It is also possible to form the magnetoresistive element shown in FIG. 5 by providing resist films on the substrate 11 in the form of fine lines, forming multilayer films on the resist films and the substrate 11 by electron beam deposition, and thereafter lifting off the resist films, similarly to the embodiment shown in FIG. 1.

As to a sample (Example 2) of the magnetoresistive element shown in FIG. 5 and another sample (comparative example 2) of a comparative magnetoresistive element having a multilayer film similarly to Example 2 except that the same was not in the form of fine lines, magnetoresistance ratios were measured similarly to Example 1.

Figure 6:
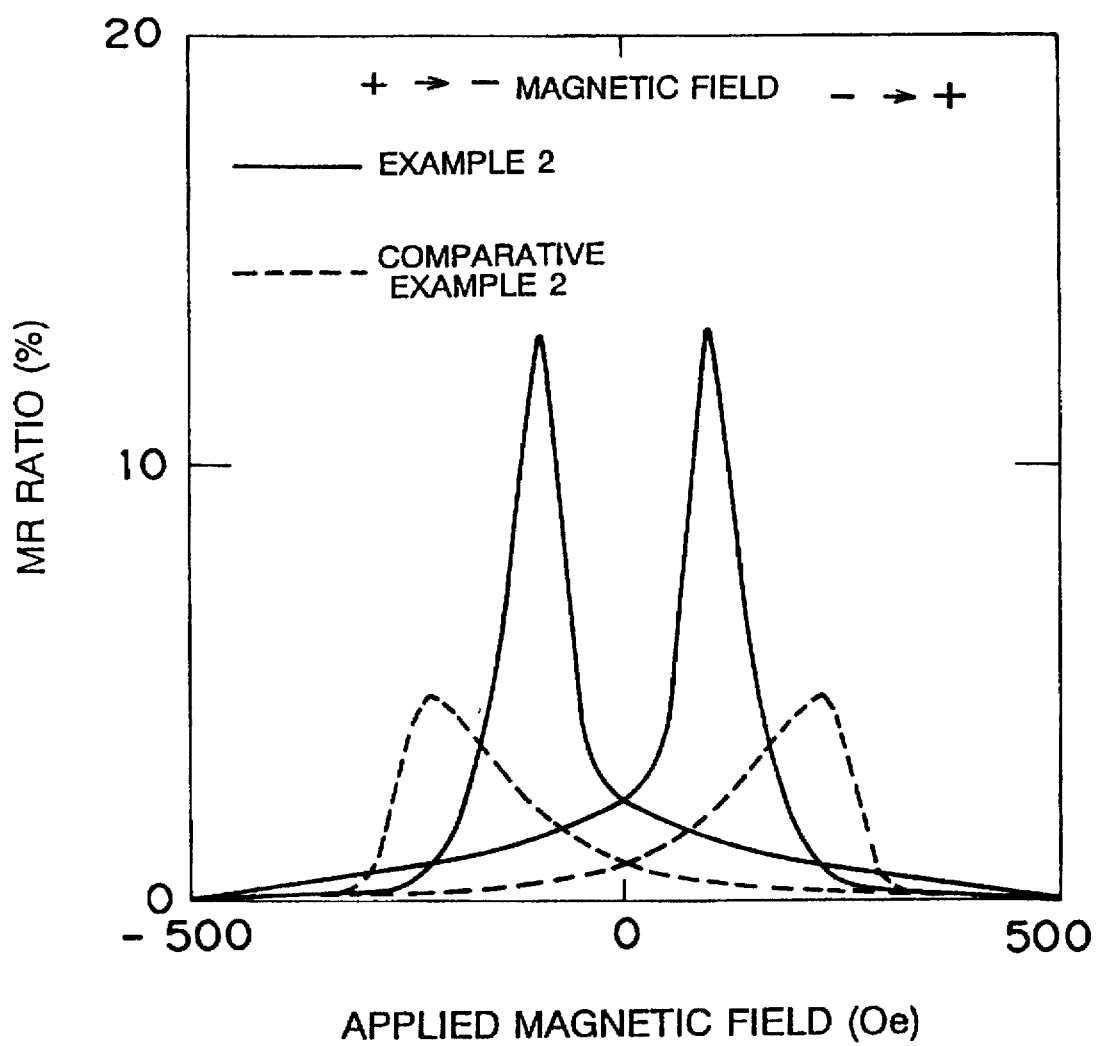
FIG. 6 illustrates relations between MR ratios and applied magnetic field strength values in magnetoresistive elements according to Example 2 and comparative example 2.

FIG. 6 illustrates relations between MR ratios and applied magnetic field strength values in the magnetoresistive elements according to Example 2 and comparative example 2.

Table 2 shows the maximum MR ratios and operating magnetic fields of the magnetoresistive elements according to Example 2 and comparative example 2.

TABLE 2

|  | Example 2 | Comparative Example 2 |
|---|---|---|
| Maximum MR Ratio (%) | 13.1 | 4.5 |
| Operating Magnetic Field (Oe) | 240 | 295 |

As clearly understood from FIG. 6 and Table 2, the element according to Example 2 has the maximum MR ratio of about 13%, which is remarkably larger than that of comparative example 2 of about 5%. Further, the operating magnetic field of Example 2 is about 240 Oe, which is remarkably smaller than that of comparative example 2 of about 300 Oe. Thus, it is understood that the saturation magnetic field is reduced in Example 2 as compared with comparative example 2.

In the spin valve type magnetoresistive film such as that in this embodiment, it is possible to attain a high MR ratio and a low operating magnetic field due to the above mentioned geometric ansisotropy and magnetic moments operating in a coherent manner.

The multilayer film which is formed by the antiferromagnetic layer, the first ferromagnetic layer, the non-magnetic conductive layer and the second ferromagnetic layer can also be selected from various other materials than those stated above.

Figure 7:
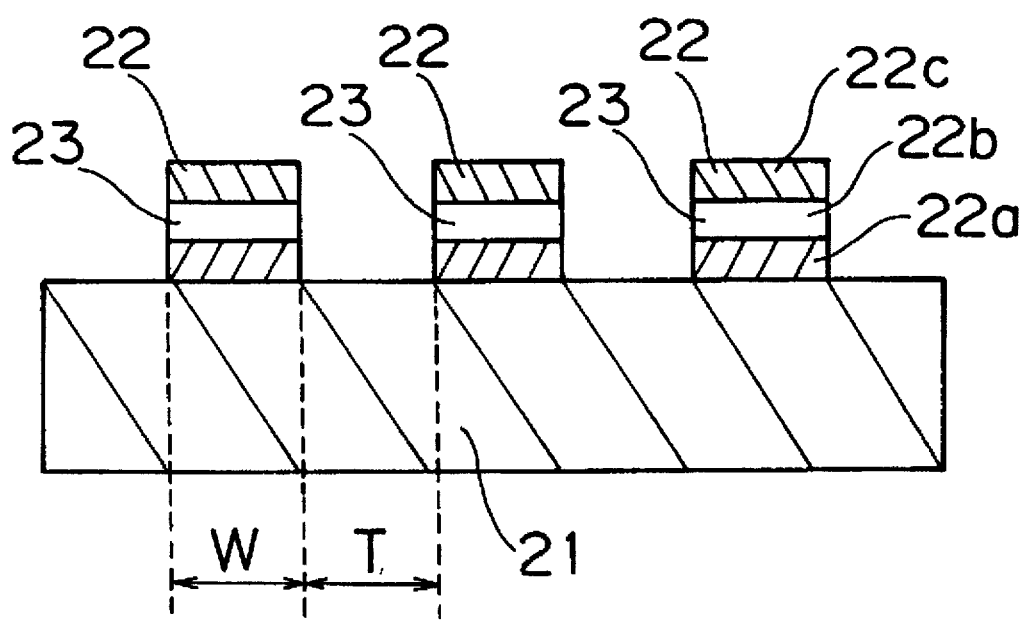
FIG. 7 is a sectional view showing a magnetoresistive element according to a second mode of the second aspect of the present invention.

FIG. 7 is a sectional view showing a magnetoresistive element according to a second mode of the second aspect of the present invention. Referring to FIG. 7, a plurality of fine lines 22 having widths W are provided on a non-magnetic substrate 21 of glass to be separated from each other at distances T in a parallel manner. Each fine line portion 22 is formed by a laminate 23 which is obtained by stacking a first ferromagnetic layer 22a, a non-magnetic conductive layer 22b, and a second ferromagnetic layer 22c with each other. The first ferromagnetic layer 22a is formed by an Fe film having a thickness of 56 Å, while the non-magnetic conductive layer 22b is formed by a Cu film having a thickness of 50 521 and the second ferromagnetic layer 22c is formed by a Co film having a thickness of 48 Å.

It is also possible to form the magnetoresistive element shown in FIG. 7 by providing resist films on the substrate 21 in the form of fine lines, forming the aforementioned multilayer films on the, resist films and the substrate 21 by electron beam deposition, and thereafter lifting off the resist films, similarly to the embodiment shown in FIG. 1.

As to a sample (Example 3) of the magnetoresistive element shown in FIG. 7 and another sample (comparative example 3) of a comparative magnetoresistive element having a multilayer film similarly to Example 3 except that the same was not in the form of fine lines, magnetoresistance ratios were measured similarly to Example 1.

Figure 8:
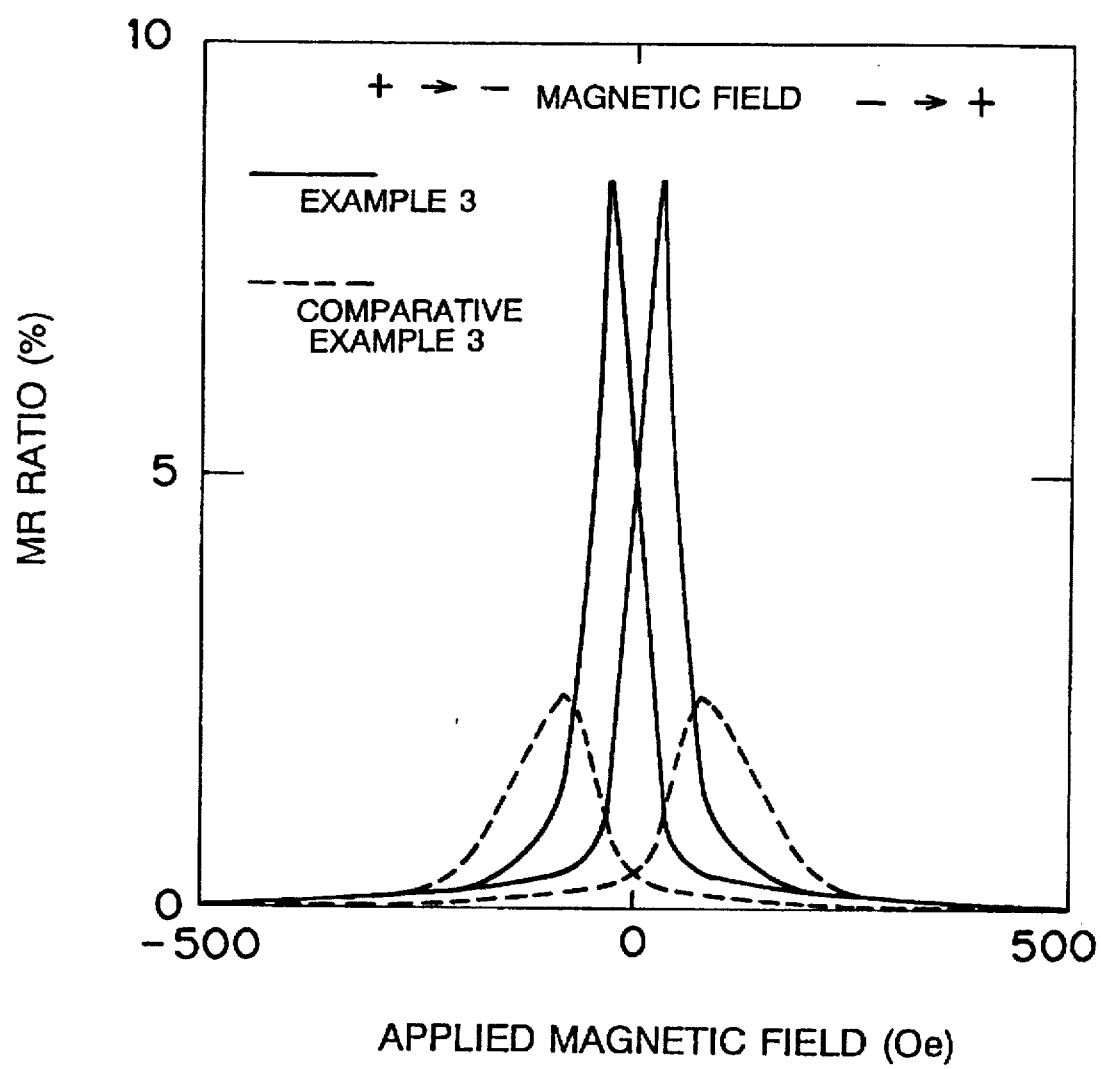
FIG. 8 illustrates relations between MR ratios and applied magnetic field strength values in magnetoresistive elements according to Example 3 and comparative example 3.

FIG. 8 illustrates relations between MR ratios and applied magnetic field strength values in the magnetoresistive elements according to Example 3 and comparative example 3. Table 3 shows the maximum MR ratios and operating magnetic fields of the magnetoresistive elements according to Example 3 and comparative example 3.

TABLE 3

|  | Example 3 | Comparative Example 3 |
| --- | --- | --- |
| Maximum MR Ratio (%) | 8.6 | 2.5 |
| Operating Magnetic Field (Oe) | 170 | 250 |

As clearly understood from FIG. 8 and Table 3, the element according to Example 3 has the maximum MR ratio of about 9%, which is remarkably larger than that of comparative example 3 of about 3%. Further, the operating magnetic field of Example 3 is about 170 Oe, which is remarkably smaller than that of comparative example 3 of about 250 Oe. Thus, it is understood that the saturation magnetic field is reduced in Example 3 as compared with comparative example 3.

Due to the above mentioned geometric anisotropy and magnetic moments operating in a coherent manner, it is possible to attain a high MR ratio and a low operating magnetic field similarly to Example 1.

Also in this embodiment, various materials other than the above mentioned ones can be selected as long as the first and second ferromagnetic layers are different from each other in coercive force. For example, the first ferromagnetic layer, the non-magnetic conductive layer and the second ferromagnetic layer may be formed by an NiFe alloy layer, a Cu layer and a Co layer respectively.

While the distance T between each adjacent pair of the fine line portions and the width W of each fine line portion is about 2 µm respectively in each of the aforementioned embodiments, the present invention is not restricted to this value. The distance T and the width W are preferably in the range of 0.1 to 2 µm, as hereinabove described.

While the length of each fine line portion is 90 µm, in the above embodiments the present invention is not restricted to this value either. The length of each fine line portion is preferably not more than 200 µm.

According to the present invention, the layers forming the respective fine line portions are more preferably identical to each other in thicknesses and vertical positions, while the same may be substantially identical to each other, with no requirement for strict coincidence.

Figure 9:
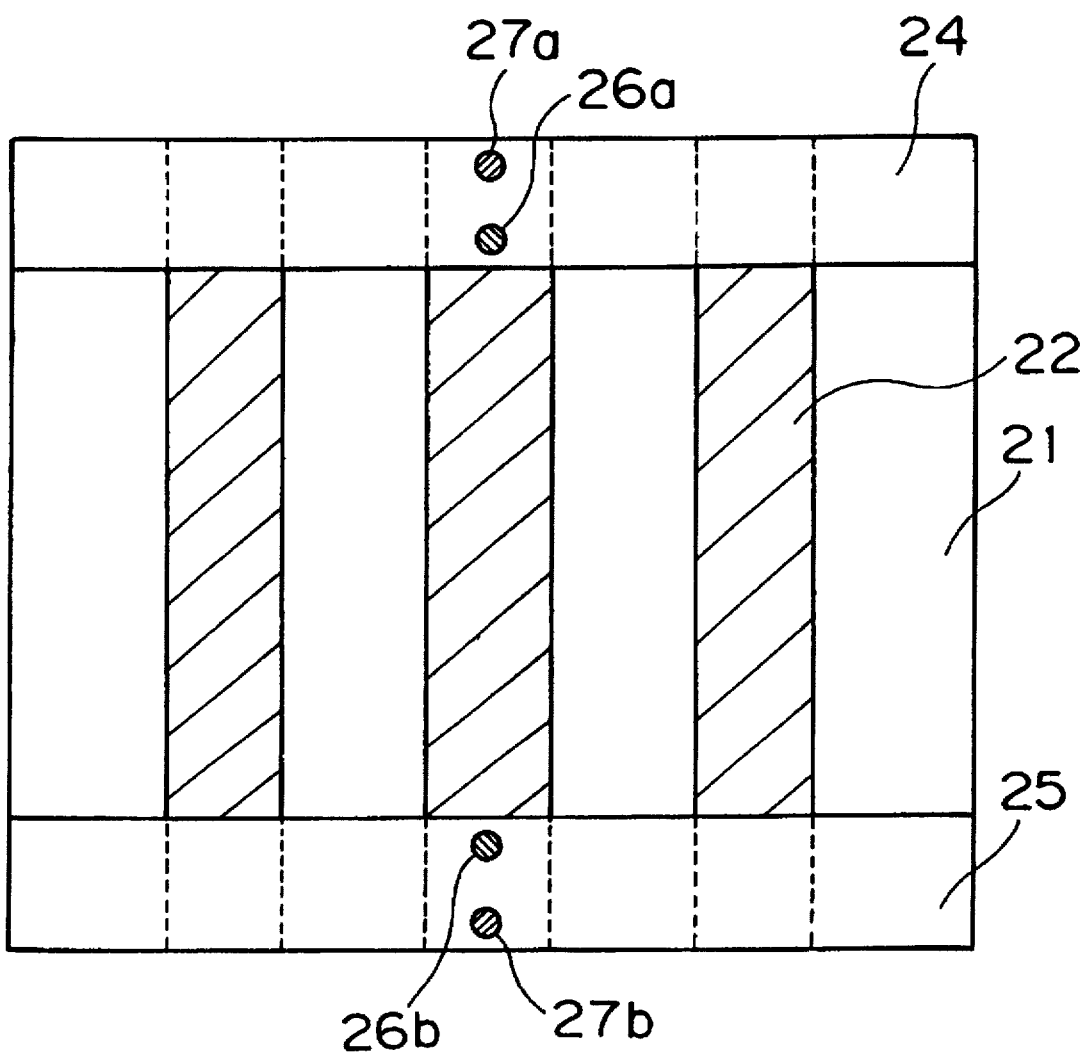
FIG. 9 is a plan view showing a magnetoresistive element according to the present invention.

FIG. 9 shows the magnetoresistive element appearing in FIG. 7, which is provided with electrodes. As shown in FIG. 9, first and second conductive layers 24 and 25 consisting of Au, for example, are provided on both end portions of the substrate 21. The first and second conductive layers 24 and 25 are provided with electrodes 27a and 27b for feeding a current and electrodes 26a and 26b for reading a voltage respectively. The first and second conductive layers 24 and 25 are connected with the respective first and second ends of opposite ends of the fine line portions in the longitudinal direction thereof 22, whereby it is possible to measure the resistance by feeding a current across the electrodes 27a and 27b and reading the voltage across the electrodes 26a and 26b.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A magnetoresistive element comprising:
 a substrate; and
 a plurality of fine line structures arranged substantially parallel to each other on said substrate;
 wherein each said fine line structure comprises a multilayer stack of at least two ferromagnetic layers and at least one non-magnetic conductive layer alternately stacked with each other, wherein an antiferromagnetic coupling is formed between said ferromagnetic layers through said non-magnetic conductive layer that is interposed therebetween, wherein each of said layers extends continuously along a longitudinal direction of each said fine line structure;
 wherein each said fine line structure is arranged so that electrons will flow substantially parallel to said longitudinal direction along which said layers of each said fine line structure extend;
 and wherein each said fine line structure extends in said longitudinal direction on said substrate and has a first end and a second end at opposite ends of said fine line structure in said longitudinal direction;
 and further comprising a first conductive member connected to and interconnecting all of said first ends of all of said fine line structures and a second conductive member connected to and interconnecting all of said second ends of all of said fine line structures.

2. The magnetoresistive element in accordance with claim 1, wherein a width of each said fine line structure and a distance between each pair of said fine line structures are not more than 10 μm respectively.

3. The magnetoresistive element in accordance with claim 1, wherein an aspect ratio of each said fine line structure is greater than 1.

4. The magnetoresistive element in accordance with claim 1, wherein an aspect ratio of each said fine line structure is at least 10.

5. The magnetoresistive element in accordance with claim 1, comprising at least 10 sets of said ferromagnetic and said non-magnetic conductive layers stacked with each other.

6. The magnetoresistive element in accordance with claim 1, wherein said ferromagnetic layers and said non-magnetic conductive layer are Co layers and a Cu layer respectively.

7. The magnetoresistive element in accordance with claim 1, further comprising means for feeding a current between said first and second conductive members connected to said first and second conductive members, and means for reading a voltage between said first and second conductive members connected to said first and second conductive members.

8. The magnetoresistive element in accordance with claim 1, wherein said layers and said longitudinal direction each respectively extend parallel to said substrate.

9. A magnetoresistive element comprising:

a substrate; and a plurality of fine line structures arranged substantially parallel to each other on said substrate;

wherein each said fine line structure comprises a multilayer stack of a first ferromagnetic layer having a first magnetic moment, a non-magnetic conductive layer arranged on said first ferromagnetic layer, and a second ferromagnetic layer arranged on said non-magnetic conductive layer and having a second magnetic moment that is apt to orient antiparallel to said first magnetic moment in a state with a weak external magnetic field applied thereto, wherein each of said layers extends continuously along a longitudinal direction of each said fine line structure;

wherein each said fine line structure is arranged so that electrons will flow substantially parallel to said longitudinal direction along which said layers of each said fine line structure extend;

and wherein each said fine line structure extends in said longitudinal direction on said substrate and has a first end and a second end at opposite ends of said fine line structure in said longitudinal direction;

and further comprising a first conductive member connected to and interconnecting all of said first ends of all of said fine line structures and a second conductive member connected to and interconnecting all of said second ends of all of said fine like structures.

10. The magnetoresistive element in accordance with claim 9, wherein each said fine line structure further comprises an antiferromagnetic layer arranged on at least one of said first ferromagnetic layer and said second ferromagnetic layer.

11. The magnetoresistive element in accordance with claim 10, wherein said antiferromagnetic layer, said first ferromagnetic layer, said non-magnetic conductive layer and said second ferromagnetic layer are MnFe, Co, Cu and NiFe layers respectively.

12. The magnetoresistive element in accordance with claim 9, wherein said first ferromagnetic layer has a first coercive force and said second ferromagnetic layer has a second coercive force that is different from said first coercive force.

13. The magnetoresistive element in accordance with claim 12, wherein said first ferromagnetic layer, said non-magnetic conductive layer and said second ferromagnetic layer are Fe, Cu and Co layers respectively.

14. The magnetoresistive element in accordance with claim 9, wherein a width of each said fine line structure and a distance between each pair of said fine line structures are not more than 10 μm respectively.

15. The magnetoresistive element in accordance with claim 9, wherein an aspect ratio of each said fine line structure is greater than 1.

16. The magnetoresistive element in accordance with claim 9, wherein an aspect ratio of each said fine line structure is at least 10.

17. The magnetoresistive element in accordance with claim 9, wherein said layers and said longitudinal direction each respectively extend parallel to said substrate.

18. A magnetoresistive element comprising:

a substrate; and a plurality of fine line structures arranged substantially parallel to each other on said substrate;

wherein each said fine line structure comprises a multilayer stack of a first ferromagnetic layer, a non-magnetic conductive layer arranged on said first ferromagnetic layer, a second ferromagnetic layer arranged on said non-magnetic conductive layer, and an antiferromagnetic layer arranged on at least one of said first ferromagnetic layer and said second ferromagnetic layer, wherein each of said layers extends continuously along a longitudinal direction of each said fine line structure;

wherein each said fine line structure is arranged so that electrons will flow substantially parallel to said longitudinal direction along which said layers of each said fine line structure extend;

and wherein each said fine line structure extends in said longitudinal direction on said substrate and has a first end and a second end at opposite ends of said fine line structure in said longitudinal direction;

and further comprising a first conductive member connected to and interconnecting all of said first ends of all of said fine line structures and a second conductive member connected to and interconnecting all of said second ends of all of said fine line structures.

19. The magnetoresistive element in accordance with claim 18, wherein said layers and said longitudinal direction each respectively extend parallel to said substrate.

20. A magnetoresistive element comprising:

a substrate; and a plurality of fine line structures arranged substantially parallel to each other on said substrate;

wherein each said fine line structure comprises a multilayer stack of a first ferromagnetic layer having a first coercive force, a non-magnetic conductive layer arranged on said first ferromagnetic layer, and a second ferromagnetic layer arranged on said non-magnetic conductive layer and having a second coercive force that is different from said first coercive force, wherein each of said layers extends continuously along a longitudinal direction of each said fine line structure;

wherein each said fine line structure is arranged so that electrons will flow substantially parallel to said longitudinal direction along which said layers of each said fine line structure extend;

and wherein each said fine line structure extends in said longitudinal direction on said substrate and has a first end and a second end at opposite ends of said fine line structure in said longitudinal direction;

and further comprising a first conductive member connected to and interconnecting all of said first ends of all of said fine line structures and a second conductive member connected to and interconnecting all of said second ends of all of said fine line structures.

21. The magnetoresistive element in accordance with claim 20, wherein said layers and said longitudinal direction each respectively extend parallel to said substrate.

* * * * *

UNITED STATES PATENT AND TRADEMARK OFFICE
CERTIFICATE OF CORRECTION

PATENT NO. : 5,695,858

DATED : Dec. 9, 1997

INVENTOR(S) : Maeda et al.

It is certified that error appears in the above-identified patent and that said Letters Patent is hereby corrected as shown below:

On the Title Page:
In [75] replace the inventor information to read:
--Atsushi Maeda; Neyagawa; Japan;
Minoru Kume; Kadoma; Japan;
Toshio Tanuma; Toyonaka; Japan.--

In Item [56]
in line 7, please replace "Partin" by --Partin et al.--.

In Col. 9, line 21, replace "50 521" by --50 Å--.
In Col. 10, line 27, after "portions" insert --22--;
line 28, delete "22".

Signed and Sealed this

Twenty-eighth Day of April, 1998

Attest:

BRUCE LEHMAN

Attesting Officer

Commissioner of Patents and Trademarks